(12) United States Patent
Lai (10) Patent No.: US 11,688,688 B2
(45) Date of Patent: Jun. 27, 2023

(54) MEMORY DEVICE INCLUDING A LANDING PAD WITH INCREASED THICKNESS OF A CONDUCTIVE FILM IN THE LANDING AREA

(71) Applicant: MACRONIX INTERNATIONAL CO., LTD., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 182 days.

(21) Appl. No.: 17/249,837

(22) Filed: Mar. 16, 2021

(65) Prior Publication Data

US 2022/0302029 A1    Sep. 22, 2022

(51) Int. Cl.
*H01L 23/528*    (2006.01)
*H01L 21/768*    (2006.01)
*H01L 23/535*    (2006.01)
*H01L 23/522*    (2006.01)

(52) U.S. Cl.
CPC .... *H01L 23/5283* (2013.01); *H01L 21/76895* (2013.01); *H01L 23/5226* (2013.01); *H01L 23/535* (2013.01)

(58) Field of Classification Search
CPC ............. H01L 23/5283; H01L 23/5226; H01L 23/535; H01L 21/76895
See application file for complete search history.

(56) References Cited

U.S. PATENT DOCUMENTS

| | | |
|---|---|---|
| 9,941,153 B1 | 4/2018 | Yang |
| 10,504,901 B2 | 12/2019 | Yoo et al. |
| 2015/0255385 A1 | 9/2015 | Lee et al. |
| 2015/0287710 A1* | 10/2015 | Yun ..................... H01L 27/1157 257/314 |
| 2018/0053686 A1* | 2/2018 | Hyun ................ H01L 21/76877 |
| 2020/0105783 A1* | 4/2020 | Baek ................ H01L 21/76898 |
| 2020/0286916 A1 | 9/2020 | Hojo et al. |

FOREIGN PATENT DOCUMENTS

TW    201907490 A    2/2019

OTHER PUBLICATIONS

Clark, et al.: "Perspective: New process technologies required for future devices and scaling"; Article in APL Materials May 2018; discussions, stats, and author profiles for this publication at: https://www.researchgate.net/publication/325438024; pp. 1-14.

* cited by examiner

*Primary Examiner* — Shahed Ahmed
*Assistant Examiner* — Vicki B. Booker
(74) *Attorney, Agent, or Firm* — McClure, Qualey & Rodack, LLP (57) ABSTRACT

A semiconductor structure is provided. The semiconductor structure includes a staircase structure including a first stair layer and a second stair layer on the first stair layer. The first stair layer comprises a first conductive film. The semiconductor structure includes a landing pad disposed on the first conductive film. The landing pad has a first pad sidewall facing toward the second stair layer, a first lateral gap distance between an upper portion of the first pad sidewall and the second stair layer is smaller than a second lateral gap distance between a lower portion of the first pad sidewall and the second stair layer.

18 Claims, 6 Drawing Sheets

MEMORY DEVICE INCLUDING A LANDING PAD WITH INCREASED THICKNESS OF A CONDUCTIVE FILM IN THE LANDING AREA

BACKGROUND

Technical Field

The present disclosure relates to a semiconductor structure, and more particularly to a semiconductor structure including a landing pad.

Description of the Related Art

With the scaling and miniaturization of semiconductor structures, forming interconnections, such as contact structures, in a semiconductor structure becomes more and more difficult. For example, the miniaturization of semiconductor structure results in very thin conductive films in the semiconductor structure, and it is difficult to stop the etching process for forming interconnections at very thin conductive films. Therefore, an over-etching problem occurs frequently and loss of yield happens.

It is important to provide technology for semiconductor structures with improved interconnections.

SUMMARY

The present disclosure relates to a semiconductor structure including a landing pad and a method for manufacturing the same. Specifically, the semiconductor structure can be used in a staircase region of a memory device.

According to an embodiment of the present disclosure, a semiconductor structure is provided. The semiconductor structure includes a staircase structure including a first stair layer and a second stair layer on the first stair layer, wherein the first stair layer includes a first conductive film. The semiconductor structure includes a landing pad disposed on the first conductive film. The landing pad has a first pad sidewall facing toward the second stair layer, a first lateral gap distance between an upper portion of the first pad sidewall and the second stair layer is smaller than a second lateral gap distance between a lower portion of the first pad sidewall and the second stair layer.

According to another embodiment of the present disclosure, a semiconductor structure is provided. The semiconductor structure includes a staircase structure including a first stair layer and a second stair layer on the first stair layer, wherein the first stair layer includes a first conductive film. The semiconductor structure includes a landing pad disposed on the first conductive film. The landing pad has a first pad sidewall including a concave sidewall portion facing toward the second stair layer.

According to yet another embodiment of the present disclosure, a semiconductor structure is provided. The semiconductor structure includes a staircase structure including a stair layer, wherein the stair layer includes an insulating film and a conductive film on the insulating film, the insulating film and the conductive film has a coplanar stair side all. The semiconductor structure includes a landing pad on the conductive film. The landing pad includes a bottom surface extending beyond the coplanar stair sidewall.

The above and other embodiments of the disclosure will become better understood with regard to the following

2 detailed description of the non-limiting embodiment(s). The following description is made with reference to the accompanying drawings.

DETAILED DESCRIPTION

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

FIGS. 1-6 illustrate a method for manufacturing a semiconductor structure according to an embodiment of the present disclosure.

Figure 1:
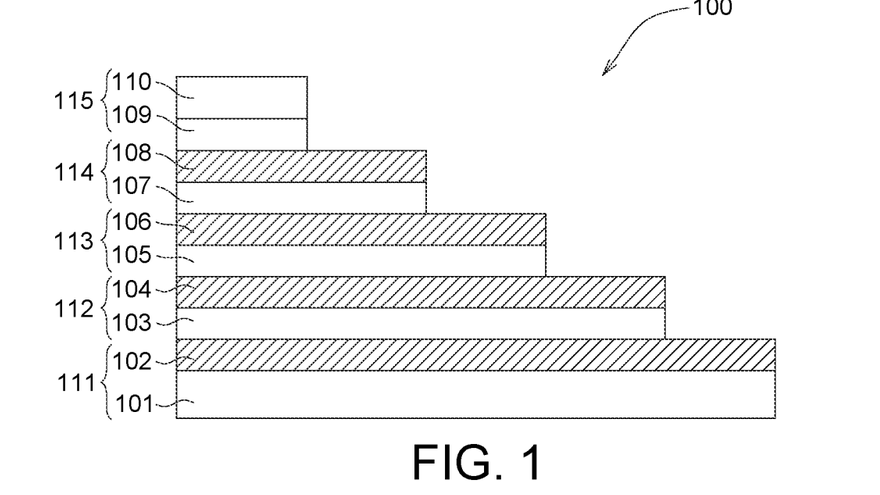
FIGS. 1-6 illustrate a method for manufacturing a semiconductor structure according to an embodiment of the present disclosure.

Referring to FIG. 1, a staircase stack 100 is provided. The staircase stack 100 includes insulating stair layers arranged one on top of another. Each of the insulating stair layers includes an insulating film and a dielectric film on the insulating film. For example, the staircase stack 100 includes an insulating stair layer 111, an insulating stair layer 112 on the insulating stair layer 111, an insulating stair layer 113 on the insulating stair layer 112, and an insulating stair layer 114 on the insulating stair layer 113. The insulating stair layer 111 includes an insulating film 101 and a dielectric film 102 on the insulating film 101; the insulating stair layer 112 includes an insulating film 103 and a dielectric film 104 on the insulating film 103; the insulating stair layer 113 includes an insulating film 105 and a dielectric film 106 on the insulating film 105; the insulating stair layer 114 includes an insulating film 107 and a dielectric film 108 on the insulating film 107. The staircase stack 100 may include more or fewer insulating stair layers. A lower insulating stair layer of the insulating stair layers has an area larger than an area of an upper insulating stair layer of the insulating stair layers. The staircase stack 100 may further include an upper stair layer 115 on the insulating stair layer 114. The upper stair layer 115 includes an oxide 109 and a hard mask film 110 on the oxide film 109. In an embodiment, the insulating film may include oxide, such as silicon oxide. The dielectric film may include nitride, such as silicon nitride. The oxide film 109 may include silicon oxide. The hard mask film 110 may include silicon, such as polysilicon. The insulating film and the dielectric film in the same insulating stair layer may have a coplanar stair sidewall. The oxide film 109 and the hard mask film 110 may have a coplanar stair sidewall.

Figure 2:
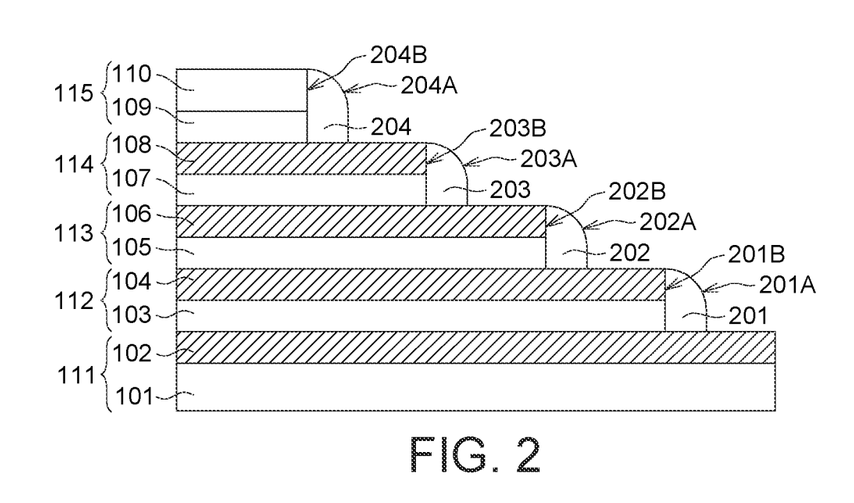

Referring to FIG. 2, spacers 201, 202, 203 and 204 are then formed on the insulating stair layers 111, 112, 113 and 114 respectively. The spacer 201 is formed on the insulating stair layer 111 and on a sidewall of the insulating stair layer 112. The spacer 202 is formed on the insulating stair layer 112 and on a sidewall of the insulating stair layer 113. The spacer 203 is formed on the insulating stair layer 113 and on a sidewall of the insulating stair layer 114. The spacer 204 is formed the insulating stair layer 114 and on a sidewall of the upper stair layer 115. In an embodiment, the spacer may be formed by a deposition process and a reactive-ion etch (RIE) process. The spacer may include a material different from the insulating stair layer and having etch selectivity as compared with the insulating stair layer. For example, the spacer may include a conductive material, such as metal, or a semiconductor material, such as polysilicon. The spacer 201/202/203/204 has a first spacer sidewall 201A/202A/203A/204A and a second spacer sidewall 201B/202B/203B/204B opposite to the first spacer sidewall 201A/202A/203A/204A. The first spacer sidewall 201A/202A/203A of the spacer 201/202/203 faces away from the sidewall of the insulating stair layer 112/113/114, where the spacer 201/202/203 is formed. The first spacer sidewall 204A of the spacer 204 faces away from the sidewall of the upper stair layer 115, where the spacer 204 is formed. The second spacer sidewall 201B/202B/203B of the spacer 201/202/203 faces toward, or be in contact with, the sidewall of the insulating stair layer 112/113/114, where the spacer 201/202/203 is formed. The second spacer sidewall 204B of the spacer 204 faces toward, or be in contact with, the sidewall of the upper stair layer 115, where the spacer 204 is formed. The first spacer sidewall 201A/202A/203A/204A of the spacer 201/202/203/204 may include a curved sidewall portion. In an embodiment, the first spacer sidewall 201A/202A/203A/204A of the spacer 201/202/203/204 may include a rounded corner. In an embodiment, the first spacer sidewall 201A/202A/203A/204A of the spacer 201/202/203/204 may include a convex sidewall portion.

Figure 3:
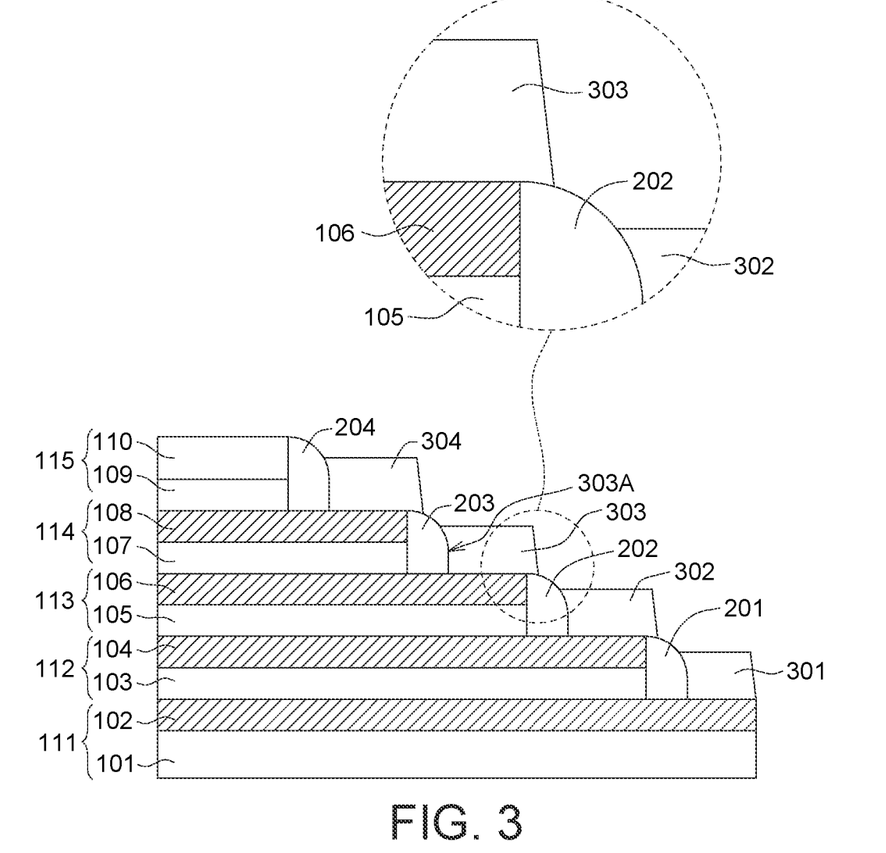

Referring to FIG. 3, sacrificial layers 301, 302, 303 and 304 are then formed on the insulating stair layers 111, 112, 113 and 114 respectively. For example, the sacrificial layers 301, 302, 303 and 304 may be formed by a dielectric on dielectric process for selective growth of the sacrificial layer. The sacrificial layers 301, 302, 303 and 304 are separated from each other. The sacrificial layer is separated from the insulating stair layer in the same stair of the staircase stack 100 by the spacer in the same stair. For example, the sacrificial layer 302 is separated from the insulating stair layer 113 by the spacer 202 in the same stair. The sacrificial layers 301, 302, 303 and 304 may be formed on the first spacer sidewalk 201A, 202A, 203A and 204A of the spacers 201, 202, 203 and 204 respectively. In an embodiment, the sacrificial layers 301, 302, 303 and 304 may be formed conformally on the first spacer side ails 201A, 202A, 203A and 204A of the spacers 201, 202, 203 and 204 respectively. A sacrificial layer sidewall of the sacrificial layer 301/302/303/304 may be shape complementary to at least part of the first spacer side all 201A/202A/203A/204A of the spacer 201/202/203/204, on which the sacrificial layer sidewall of the sacrificial layer 301/302/303/304 is formed. For example, as exemplarily shown in FIG. 3, the sacrificial layer sidewall 303A of the sacrificial layer 303 may have a concave curved shape complementary to part of the first spacer sidewall 203A of the spacer 203. A bottom surface of the sacrificial layer 301/302/303/304 may extend beyond the insulating stair layer 111/112/113/114, which is next to and below the sacrificial layer 301/302/303/304. For example, the bottom surface of the sacrificial layer 303 may extend beyond the insulating stair layer 113 and be in contact with the spacer 202.

In FIG. 3, the sacrificial layers 301, 302, 303 and 304 may have heights smaller than heights of the insulating stair layers 112, 113 and 114 and the upper stair layer 115 respectively, while not limited thereto. The height of the sacrificial layer 301/302/303/304 may be adjustable on the basis of process window; for example, the height of the sacrificial layer 301/302/303 may be higher than, equal to or smaller than the height of the insulating stair layer 112/113/114 in the same stair of the staircase stack 100, and the height of the sacrificial layer 304 may be higher than, equal to or smaller than the height of the upper stair layer 115. The sacrificial layer 301/302/303/304 may include nitride, such as silicon nitride.

Figure 4:
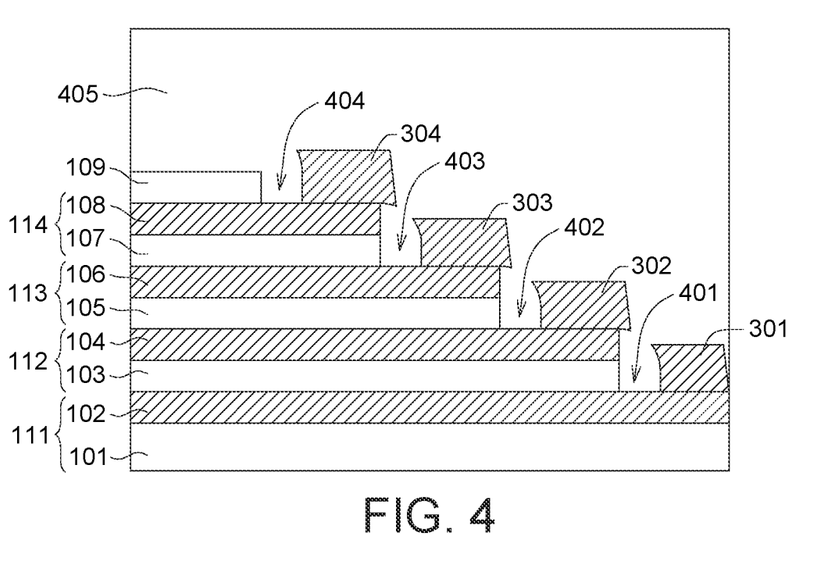

Referring to FIG. 4, the spacers 201, 202, 203 and 204 and hard mask film 110 are then removed, for example by using SC1 or TMAH chemistry, to form recesses 401, 402, 403 and 404. A dielectric structure 405 is formed on the sacrificial layers 301-304, the insulating stair layers 111-114 and the oxide film 109 and filling the recesses 401-404. The dielectric structure 405 may comprise an oxide such as silicon oxide.

Figure 5:
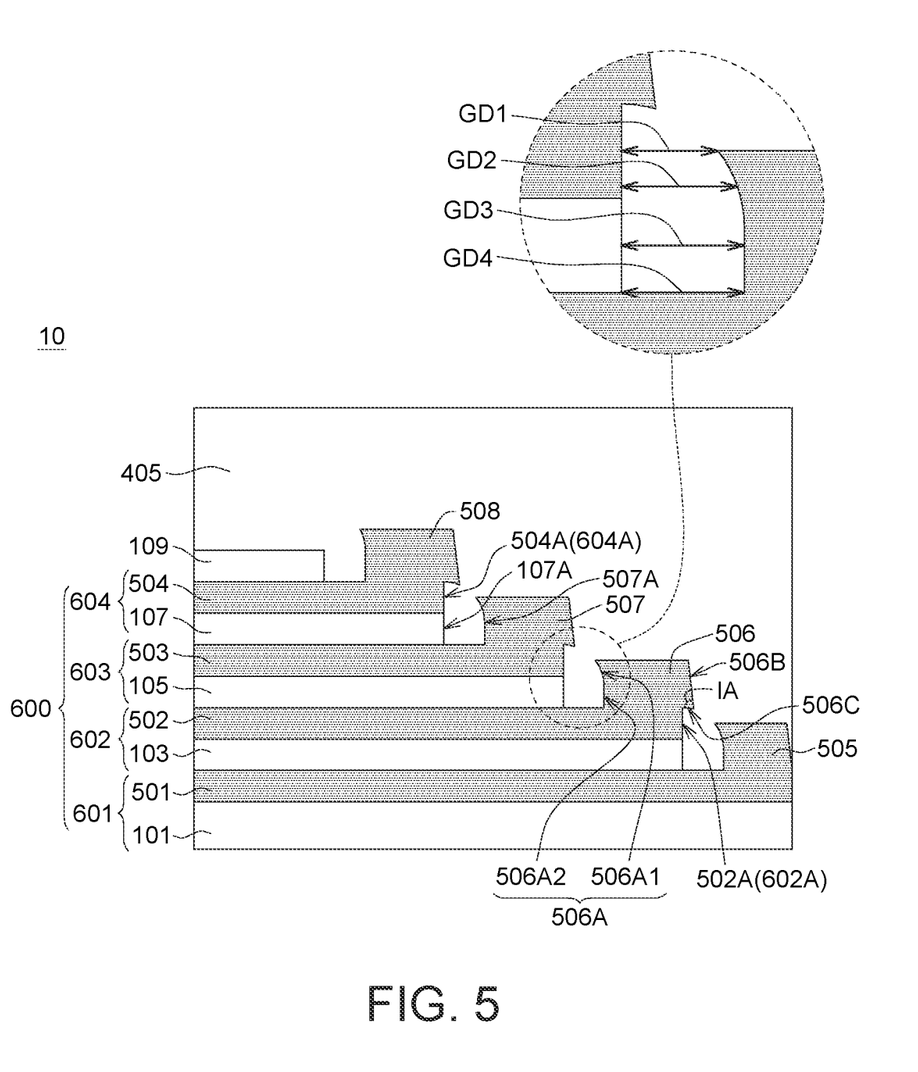

Referring to FIG. 5, the dielectric films 102, 104, 106 and 108 are removed, for example, by applying an etching process, to form spaces, and such spaces are filled with materials of conductive films 501, 502, 503 and 504, for example, by a deposition process. Consequently, the dielectric films 102, 104, 106 and 108 are replaced with the conductive films 501, 502, 503 and 504. Similarly, the sacrificial layers 301-304 are removed, for example, by applying an etching process, to form spaces, and such spaces are filled with materials of landing pads 505, 506, 507 and 508, for example, by a deposition process. Consequently, the sacrificial layers 301, 302, 303 and 304 are replaced with the landing pads 505-508. The formations of the conductive films 501-504 and the landing pads 505-508 may be performed at the same time. The conductive films 501-504 may include tungsten (W) or titanium/tungsten (Ti/W). The landing pads 505-508 may include W or Ti/W.

Through performing the method shown in FIGS. 1-5, a semiconductor structure 10 is provided. The semiconductor structure 10 includes a staircase structure 600, the landing pads 505-508 and the dielectric structure 405 on the staircase structure 600 and the landing pads 505-508. The staircase structure 600 includes a stair layer 601, a stair layer 602 on the stair layer 601, a stair layer 603 on the stair layer 602, a stair layer 604 on the stair layer 603, and the oxide film 109 on the stair layer 604. The stair layer 601 includes the insulating film 101 and the conductive film 501 on the insulating film 101. The stair layer 602 includes the insulating film 103 and the conductive film 502 on the insulating film 103. The stair layer 603 includes the insulating film 105 and the conductive film 503 on the insulating film 105. The stair layer 604 includes the insulating film 107 and the conductive film 504 on the insulating film 107. A lower stair layer of the stair layers has an area larger than an area of an upper stair layer of the stair layers. The landing pads 505, 506, 507 and 508 are on the stair layers 601, 602, 603 and 604 respectively. The landing pads 505, 506, 507 and 508 are separated from the stair layers 602, 603 and 604 and the oxide film 109 respectively.

In an embodiment, the insulating film and the conductive film in the same stair layer may have a coplanar stair sidewall. For example, the insulating film 107 and the conductive film 504 may have a coplanar stair sidewall 604A. In an embodiment, the insulating film sidewall of the insulating film and the conductive film sidewall of the conductive film in the same stair layer may be vertical and aligned with each other. For example, the insulating film sidewall 107A of the insulating film 107 and the conductive film sidewall 504A of the conductive film 504 may be vertical and aligned with each other.

The shapes of the landing pads 505, 506, 507 and 508 may depend on the shapes of the sacrificial layers 301, 302, 303 and 304. For example, the landing pad 506 disposed on the conductive film 502 (e.g. first conductive film) of the stair layer 602 (e.g. first stair layer) has a first pad sidewall 506A facing toward the stair layer 603 (e.g. second stair layer) on the stair layer 602. The landing pad 506 has a second pad sidewall 506B opposite to the first pad sidewall 506A. The first pad sidewall 506A may include a concave sidewall portion 506A1 facing toward the stair layer 603 (e.g. second stair layer). The concave sidewall portion 506A1 of the first pad sidewall 506A of the landing pad 506 may be in an upper portion of the first pad sidewall 506A. As shown in FIG. 5, the concave sidewall portion 506A1 of the first pad sidewall 506A of the landing pad 506 may be a curved portion. The first pad sidewall 506A may further include a straight sidewall portion 506A2 facing toward the stair layer 603 (e.g. second stair layer), and the straight sidewall portion 506A2 is below the concave sidewall portion 506A1. The second pad sidewall 506B of the landing pad 506 may include an inclined sidewall portion, that is, the second pad sidewall 506B may not be vertical. In this embodiment, an internal angle of the landing pad between the second pad sidewall and a bottom surface of the landing pad may be an acute angle. For example, the internal angle IA of the landing pad 506 between the second pad sidewall 506B and the bottom surface 506C of the landing pad 506 is an acute angle.

The bottom surface 506C of the landing pad 506 may extend beyond a conductive film sidewall 502A of the conductive film 502. In an embodiment, the insulating film 103 and the conductive film 502 of the stair layer 602 may have a coplanar stair sidewall 602A, and the bottom surface 506C of the landing pad 506 may extend beyond the coplanar stair sidewall 602A of the stair layer 602.

Lateral gap distances between the first pad sidewall of the landing pad and the stair layer may have several values since the first pad sidewall may include the concave sidewall portion. For example, the lateral gap distances between the first pad sidewall 506A and the stair layer 603 may be defined as the lateral gap distances GD1, GD2, GD3 and GD4 with several values since the first pad sidewall 506A includes the concave sidewall portion 506A1. In an embodiment, the first pad sidewall 506A includes the concave sidewall portion 506A1 in the upper portion, the lateral gap distances between the first pad sidewall 506A and the stair layer 603 may decrease from bottom to top. The lateral gap distances GD1 and GD2 (e.g. the first lateral gap distance) between an upper portion of the first pad sidewall 506A and the stair layer 603 (e.g. the second stair layer) may be smaller than the lateral gap distances GD3 and GD4 (e.g. the second lateral gap distance) between a lower portion of the first pad sidewall 506A and the stair layer 603 (e.g. the second stair layer). The lateral gap distance GD1 may be defined as the lateral gap distance between the top of the first pad sidewall 506A (i.e. an upper surface of the landing pad 506) and the conductive film 503 (e.g. the second conductive film) of the stair layer 603 (e.g. the second stair layer), and the lateral gap distance GD2 is defined as the lateral gap distance between any place of the upper portion of the first pad sidewall 506A, except the top of the first pad sidewall 506A, and the stair layer 603. In an embodiment, the lateral gap distance GD2 (e.g. the first lateral gap distance) may be defined as the lateral gap distance between the upper portion of the first pad sidewall 506A and the conductive film 503 (e.g. the second conductive film) of the stair layer 603 (e.g. the second stair layer). In an embodiment, the lateral gap distance GD2 (e.g. the first lateral gap distance) gradually decreases along a direction away from the stair layer 602 (e.g. the first stair layer). The lateral gap distance GD1 may be smaller than the lateral gap distance GD2. The lateral gap distance GD1 may be a minimum lateral gap distance among the lateral gap distances between the first pad sidewall 506A and the stair layer 603 (e.g. the second stair layer).

The lateral gap distance GD4 may be defined as the lateral gap distance between the bottom of the first pad sidewall 506A and the insulating film 105 of the stair layer 603, and the lateral gap distance GD3 may be defined as the lateral gap distance between any place of the lower portion of the first pad sidewall 506A, except the bottom of the first pad sidewall 506A, and the stair layer 603. In an embodiment, the lateral gap distance GD3 (e.g. the second lateral gap distance) may be defined as the lateral gap distance between the lower portion of the first pad sidewall 506A and the insulating film 105 of the stair layer 603 (e.g. the second stair layer). The lateral gap distance may be a gap distance along a horizontal direction perpendicular to the vertical direction.

In an embodiment, the first pad sidewall 506A includes a straight sidewall portion 506A2 below the concave sidewall portion 506A1 and in lower half of the first pad sidewall 506A: the lateral gap distance GD3 may be equal to the lateral gap distance GD4.

The relation of the landing pads relative to the stair layers can be realized by the analogy. For example, the landing pad 507 disposed on the conductive film 503 (e.g. first conductive film) of the stair layer 603 (e.g. first stair layer) has the first pad sidewall 507A facing toward the stair layer 604 (e.g. second stair layer) on the stair layer 603.

Figure 6:
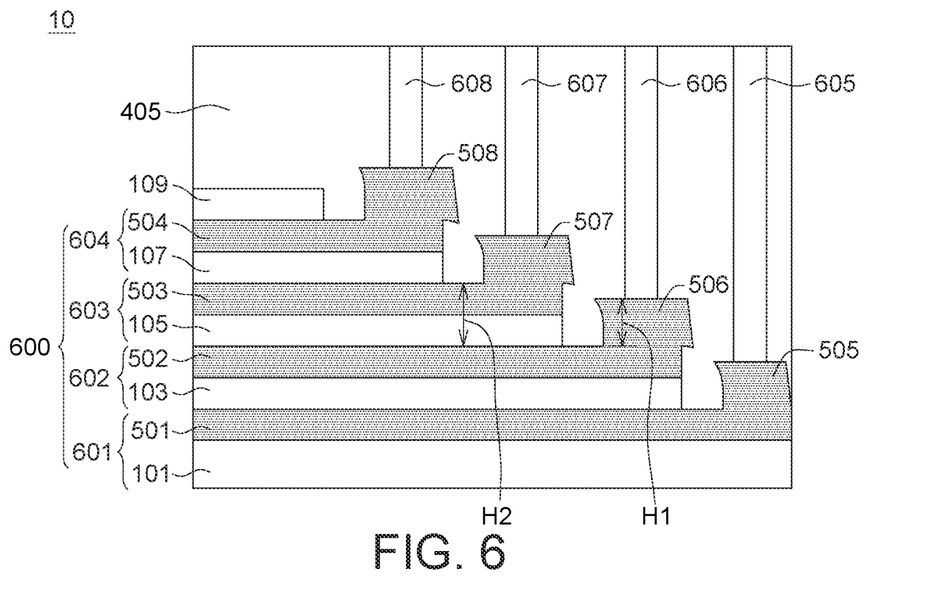

Referring to FIG. 6, the semiconductor structure 10 may further include contact structures 605, 606, 607 and 608 formed in the dielectric structure 405 and on the landing pads 505, 506, 507 and 508 respectively. The contact structures 605-608 may include conductive materials for providing electrical connections. For example, the contact structure 605 is electrically connected to the landing pad 505 and the conductive film 501. In this embodiment, the landing pads 505, 506 and 507 may have heights smaller than heights of the stair layers 602, 603 and 604 respectively. For example, the height H1 of the landing pad 506 is smaller than the height H2 of the stair layer 603 (e.g. the second stair layer).

Figure 7:
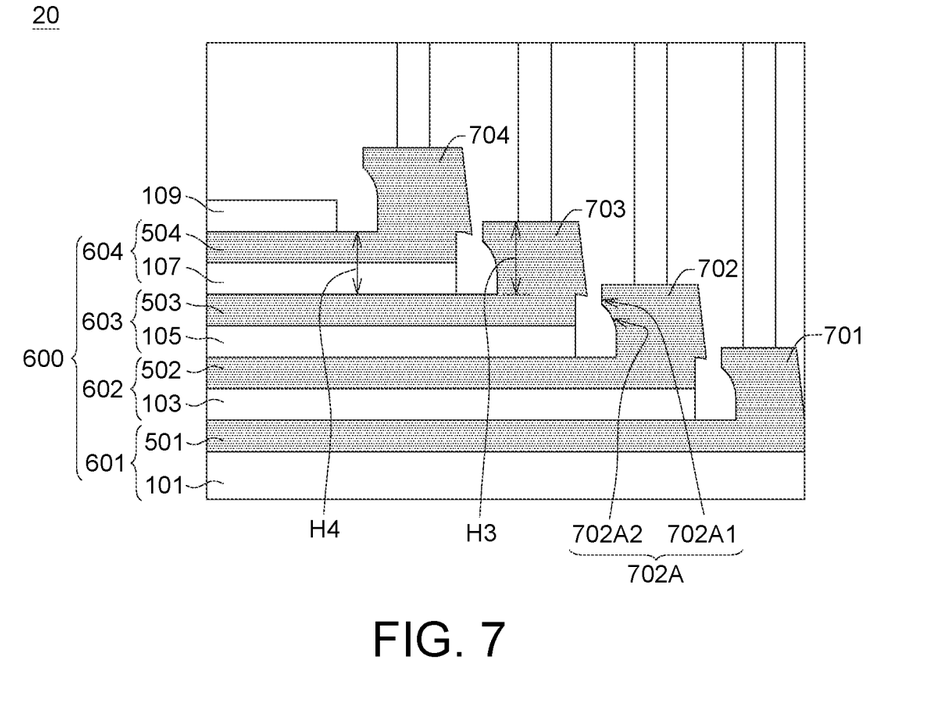
FIG. 7 illustrates a schematic view of a semiconductor structure according to an embodiment of the present disclosure.
Figure 8:
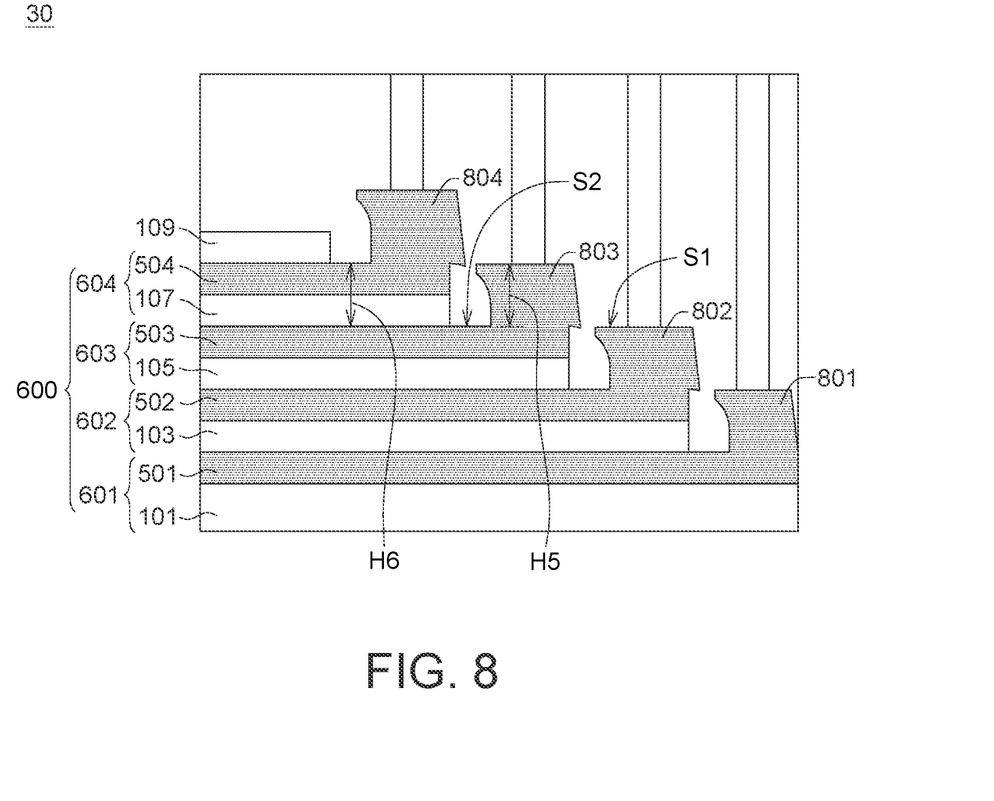
FIG. 8 illustrates a schematic view of a semiconductor structure according to an embodiment of the present disclosure.

FIG. 7 illustrates a schematic view of a semiconductor structure 20 according to an embodiment of the present disclosure. The difference between the semiconductor structure 20 and the semiconductor structure 10 is in shapes and/or heights of landing pads 701, 702, 703 and 704. In this embodiment, the landing pads 701, 702 and 703 may have heights larger than heights of the stair layers 602, 603 and 604 respectively. For example, the height H3 of the landing pad 703 is larger than the height H4 of the stair layer 604 (e.g., the second stair layer). The present disclosure is not limited thereto. In another embodiment, as shown in FIG. 8, landing pads 801, 802, 803 and 804 of semiconductor structure 30 is different from the landing pads 701, 702, 703 and 704 shown in FIG. 7 in shapes and and/or heights. In FIG. 8, the landing pads 801, 802 and 803 may have heights equal to heights of the stair layers 602, 603 and 604 respectively. For example, the height H5 of the landing pad 803 is equal to the height H6 of the stair layer 604 (e.g. the second stair layer). In an embodiment, an upper surface of the landing pad may be level with an upper surface of the stair layer; for example, the upper surface S1 of the landing pad 802 is level with the upper surface S2 of the stair layer 603 (e.g. the second stair layer), as shown in FIG. 8.

Referring back to FIG. 7, the landing pad 702 has a first pad sidewall 702A including a concave sidewall portion 702A2 facing toward the stair layer 603 (e.g. the second stair layer). The first pad sidewall 702A may further include a straight sidewall portion 702A1 facing toward the stair layer 603 (e.g. the second stair layer) and above the concave sidewall portion 702A2.

The present disclosure provides a semiconductor structure including a landing pad so as to increase essentially the thickness of the conductive film in the landing area. With use of the landing pad, the etching process for forming the contact structure can be well controlled, the over-etching problem can be prevented, and the yield can be increased.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a semiconductor structure, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
a staircase structure comprising a first stair layer and a second stair layer on the first stair layer, wherein the first stair layer comprises a first conductive film; and
a landing pad disposed on the first conductive film,
wherein the landing pad has a first pad sidewall facing toward the second stair layer, a first lateral gap distance between an upper portion of the first pad sidewall and the second stair layer is smaller than a second lateral gap distance between a lower portion of the first pad sidewall and the second stair layer, wherein the landing pad has a second pad sidewall opposite to the first pad sidewall, the second pad sidewall comprises an inclined sidewall portion.

2. The semiconductor structure according to claim 1, wherein the second stair layer comprises an insulating film and a second conductive film on the insulating film, the first lateral gap distance is between the upper portion of the first pad sidewall and the second conductive film, the second lateral gap distance is between the lower portion of the first pad sidewall and the insulating film.

3. The semiconductor structure according to claim 1, wherein a minimum lateral gap distance is between the top of the first pad sidewall and the second stair layer.

4. The semiconductor structure according to claim 1, wherein the first lateral gap distance gradually decreases along a direction away from the first stair layer.

5. The semiconductor structure according to claim 1, wherein a height of the landing pad is larger than a height of the second stair layer.

6. The semiconductor structure according to claim 1, wherein a height of the landing pad is smaller than a height of the second stair layer.

7. The semiconductor structure according to claim 1, wherein a height of the landing pad is equal to a height of the second stair layer.

8. The semiconductor structure according to claim 1, wherein an upper surface of the landing pad is level with an upper surface of the second stair layer.

9. A semiconductor structure, comprising:
a staircase structure comprising a first stair layer and a second stair layer on the first stair layer, wherein the first stair layer comprises a first conductive film; and
a landing pad disposed on the first conductive film,
wherein the landing pad has a first pad sidewall comprising a concave sidewall portion facing toward the second stair layer, wherein the landing pad has a second pad sidewall opposite to the first pad sidewall, the second pad sidewall comprises an inclined sidewall portion.

10. The semiconductor structure according to claim 9, wherein the first pad sidewall comprises a straight sidewall portion facing toward the second stair layer, the straight sidewall portion is below the concave sidewall portion.

11. The semiconductor structure according to claim 9, wherein the concave sidewall portion is in an upper portion of the first pad sidewall.

12. The semiconductor structure according to claim 9, wherein the first pad sidewall comprises a curved portion.

13. The semiconductor structure according to claim 9, wherein an internal angle of the landing pad between the second pad sidewall and a bottom surface of the landing pad is an acute angle.

14. The semiconductor structure according to claim 9, wherein the landing pad is separated from the second stair layer.

15. A semiconductor structure, comprising:
a staircase structure comprising a stair layer, wherein the stair layer comprises an insulating film and a conductive film on the insulating film, the insulating film and the conductive film has a coplanar stair sidewall; and
a landing pad on the conductive film,
wherein the landing pad comprises a bottom surface extending beyond the coplanar stair sidewall,
wherein the landing pad further comprises:
a first pad sidewall comprising a concave sidewall portion; and
a second pad sidewall opposing to the first pad sidewall and adjacent to the bottom surface of the landing pad.

16. The semiconductor structure according to claim 15, wherein the coplanar stair sidewall is vertical.

17. The semiconductor structure according to claim 15, wherein the landing pad is electrically connected to the conductive film.

18. The semiconductor structure according to claim 15, further comprising a contact structure disposed on the landing pad.

* * * * *